(12) United States Patent  (10) Patent No.: US 6,395,617 B2
Ando  (45) Date of Patent: May 28, 2002

(54) METHOD OF MANUFACTURING SEMICONDUCTOR DEVICE

(75) Inventor: Masateru Ando, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/817,662

(22) Filed: Mar. 26, 2001

(30) Foreign Application Priority Data

Mar. 27, 2000 (JP) ........................................ 2000-085797

(51) Int. Cl.[7] .............................................. H01R 21/76
(52) U.S. Cl. ...................... 438/401; 438/253; 438/239; 438/396; 257/797
(58) Field of Search ...................... 438/401, 250–256, 438/239–241, 393–399; 257/797

(56) References Cited

U.S. PATENT DOCUMENTS

| 5,237,199 A | * | 8/1993 | Morita ........................ 257/503 |
| 5,527,730 A | * | 6/1996 | Kayaoka et al. ............ 438/256 |
| 5,640,053 A | * | 6/1997 | Caldwell ..................... 257/641 |
| 5,889,335 A | * | 3/1999 | Kuroi et al. ................. 257/797 |
| 6,049,137 A | * | 4/2000 | Jang et al. .................. 257/797 |

FOREIGN PATENT DOCUMENTS

| JP | 01225135 A | * | 9/1989 | ........... H01L/21/82 |
| JP | 11-121327 | | 4/1999 | |

* cited by examiner

Primary Examiner—John F. Niebling
Assistant Examiner—Jennifer M. Kennedy
(74) Attorney, Agent, or Firm—Hayes Soloway P.C.

(57) ABSTRACT

According a method of manufacturing a semiconductor device, a polysilicon layer is formed on a semiconductor substrate and is patterned, thereby forming a storage electrode and plate electrode in a memory cell region and leaving the polysilicon layer in an aligning mark formation region. An interlevel insulating film is formed on the semiconductor substrate including the storage electrode, plate electrode, and polysilicon layer. An upper interconnection layer is formed on the polysilicon layer and is patterned, thereby forming an upper interconnection layer in the memory cell region and an aligning mark in the aligning mark formation region. An interlevel insulating film is formed on the upper interconnection layer and aligning mark and is etched back, thereby planarizing the memory cell region and aligning mark formation region and removing the interlevel insulating film on the aligning mark.

11 Claims, 8 Drawing Sheets

ENLARGEMENT

METHOD OF MANUFACTURING SEMICONDUCTOR DEVICE

BACKGROUND OF THE INVENTION

The present invention relates to a semiconductor apparatus and a method of manufacturing the same and, more particularly, to a semiconductor device with an aligning mark used for photolithography and a method of manufacturing the same.

In a semiconductor device manufacturing process, the steps of forming a deposition film on a semiconductor substrate by oxidation or sputtering, and patterning the deposition film to form an insulating pattern, interconnection pattern, or the like are repeatedly performed. This pattern formation employs a reduction projection exposure apparatus (to be referred to as a stepper hereinafter). This stepper is an apparatus which exposes a resist film formed on the semiconductor substrate by using a reticle having a pattern formed by enlarging a pattern to be actually formed by a predetermined magnification. The resist film exposed by using the stepper is developed to form a resist pattern. By using the resist pattern as an etching mask, the deposition film is processed, thereby forming a micropattern.

To align the relative positions of circuit patterns stacked on each other, when exposing the resist film, the semiconductor substrate and the reticle must be aligned relative to each other. For this purpose, an aligning mark is formed on the semiconductor substrate. The aligning mark is irradiated with light, and its position is detected from light diffracted by it upon irradiation. Then, alignment is performed.

As an example of an aligning mark manufacturing method, a method of manufacturing an aligning mark for a conventional DRAM (Dynamic Random Access Memory) will be described with reference to FIGS. 6 to 8.

As shown in FIG. 6, a field oxide film 102 is formed in an isolation region on a p-type silicon semiconductor substrate, and a gate oxide film (not shown) is formed. Successively, a word line (first lower interconnection layer; not shown) comprised of the first polysilicon layer is formed, and by using the word line, N-diffusion layers (not shown) for forming the source/drain regions of a switching MOS transistor are formed in an element region surrounded by the field oxide film 102 by self-alignment.

The first interlevel insulating film (not shown) is formed on the entire surface of a semiconductor substrate 101, and contact holes (not shown) are formed in the first interlevel insulating film and gate oxide film to reach the N-diffusion layers.

Polysilicon is deposited on the first interlevel insulating film and in the contact holes, and the resultant polysilicon layer is patterned to form bit lines (second lower interconnection layer; not shown) comprised of the second polysilicon layer and plug electrodes (not shown) for connecting the bit lines and N-diffusion layers. The second interlevel insulating film (not shown) is formed on the entire surface of the semiconductor substrate 101.

At this stage, as shown in FIG. 6, a multilayered interlevel film 103 comprised of the word line, the first interlevel insulating film, bit lines, and the second interlevel insulating film is formed in the memory cell region (circuit formation region). The interlevel film 103 has a thickness of, e.g., about 1,000 nm.

When patterning a silicon layer or metal layer, since a circuit pattern is not formed on an aligning mark formation region (e.g., a scribing region), a conductor layer deposited on the aligning mark formation region is removed. Therefore, at the aligning mark region, the first interlevel film 103 is comprised of only the first and second interlevel insulating films. Hence, as shown in FIG. 6, the thickness of the interlevel film 103 in the aligning mark region is smaller than that in the memory cell region.

Contact holes 104 for connecting storage electrodes 105 (to be described later) and the N-diffusion layers (not shown) are formed. Subsequently, as shown in FIG. 7, the storage electrodes 105 made of third polysilicon and with a thickness of about 500 nm to 800 nm are formed in the memory cell region. A capacitor insulating film (not shown) is formed on the interlevel film 103 and storage electrode 105, and after that a plate electrode 106 made of fourth polysilicon is formed on the capacitor insulating film.

A third interlevel insulating film ($SiO_2$ film, BPSG film, or the like) 107 with a thickness of about 500 nm is formed on the entire surface of the semiconductor substrate 101, and etch-back and a reflow process (e.g., in an $N_2$ atmosphere at 850° C. for 10 min) are performed to planarize the memory cell region.

After that, W (tungsten) or Al (aluminum) is deposited on the entire surface of the semiconductor substrate 101, and the deposited film is patterned to form interconnection layers 108 in the memory cell region and aligning marks 108a in the aligning mark formation region, as shown in FIG. 8.

A fourth interlevel insulating film 109 (Plasma $SiO_2$ film or the like) with a thickness of about 400 nm is formed on the entire surface of the semiconductor substrate 101, and silica films 110 are formed on the interlevel insulating film 109, thereby planarizing the memory cell region.

At this time, as shown in FIG. 8, since a step of about 900 nm to 1,200 nm is formed between the memory cell region and aligning mark formation region, the thickness of the silica film 110 formed in the aligning mark formation region is larger than those of the silica films 110 formed in the memory cell region. Hence, planarization with reference to the memory cell region cannot sufficiently remove the silica film 110 in the aligning mark formation region, and a large amount of silica (silica films 110) is left there.

Finally, as shown in FIG. 8, a fifth interlevel insulating film 111 (Plasma $SiO_2$ film or the like) with a thickness of about 400 nm is formed on the entire surface of the semiconductor substrate 101. When some layer is formed on the fifth interlevel insulating film 111 and is to be patterned, the aligning marks 108a formed in this manner are irradiated with light, and light diffracted by the aligning marks 108a is detected, so that alignment is performed.

As shown in FIG. 8, if a large amount of silica (silica film 110) is left on the aligning marks 108a, the light diffracted by the aligning marks 108a cannot be detected correctly, and the aligning precision decreases. If the aligning precision decreases, the resist pattern cannot be formed at a desired position, and consequently a micropattern such as interconnections cannot be formed accurately.

When the semiconductor substrate 101 is etched back to remove the silica film 110 on the aligning marks 108a, the memory cell region is further etched, and planarization of the memory cell region is impaired.

As a method of making smaller the step formed between the upper interconnection layer and aligning marks, Japanese Patent Laid-Open No. 11-121327 discloses a method of intentionally leaving an insulating film and conductive layer, which are formed in a circuit formation region, in an aligning mark formation region. This method does not disclose or suggest planarization between upper interconnection layers with silica, or disclose detection of aligning marks by using diffracted light.

SUMMARY OF THE INVENTION

It is an object of the present invention to provide a method of manufacturing a semiconductor device having a high aligning precision.

It is another object of the present invention to provide a method of manufacturing a semiconductor device which can be aligned easily.

In order to achieve the above objects, according to the present invention, there is provided a method of manufacturing a semiconductor device having a circuit formation region where a semiconductor circuit is to be formed and an aligning mark formation region where an aligning mark used for alignment of a mask is to be formed, the method comprising the steps of forming a first conductive layer on a semiconductor substrate and thereafter patterning the first conductive layer, thereby forming a circuit pattern in the circuit formation region and leaving the first conductive layer in the aligning mark formation region, forming a first insulating film on the semiconductor substrate including the circuit pattern and the first conductive layer, forming a second conductive layer on the first insulating film and thereafter patterning the second conductive layer, thereby forming an interconnection pattern in the circuit formation region and an aligning mark in the aligning mark formation region, and forming a second insulating film on the interconnection pattern and the aligning mark and thereafter etching back the second insulating film, thereby planarizing the circuit formation region and the aligning mark formation region and removing the second insulating film on the aligning mark.

DESCRIPTION OF THE PREFERRED EMBODIMENT

The present invention will be described in detail with reference to the accompanying drawings.

Figure 1A:
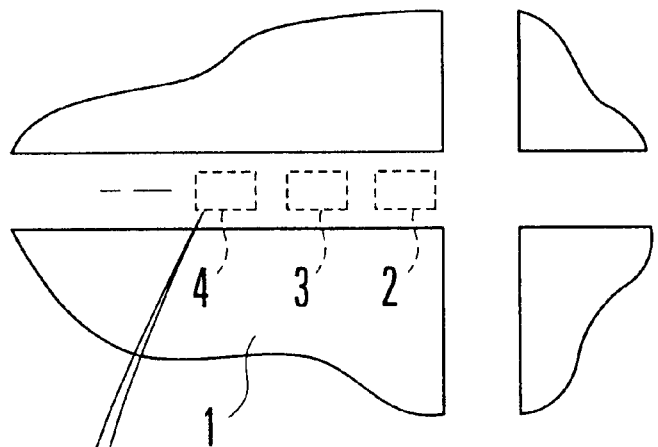
FIG. 1A is a plan view of a DRAM according to one embodiment of the present invention.
Figure 1B:
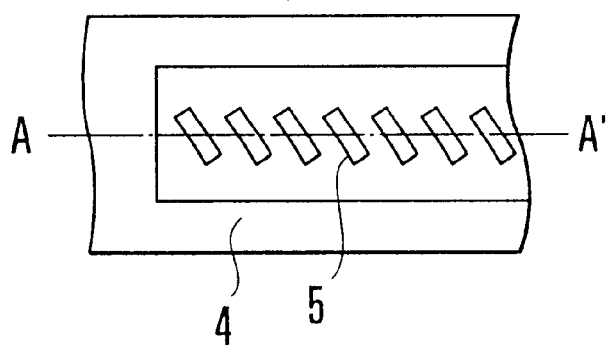
FIG. 1B is an enlarged plan view of the aligning mark region shown in FIG. 1A.

FIG. 1A shows a DRAM according to one embodiment of the present invention. As shown in FIG. 1A, aligning mark formation regions 2, 3, and 4 are located in a scribing region, which is to be subjected to dicing, around a memory cell region (circuit formation region) 1 where a memory cell is to be formed. A plurality of aligning marks 5 are formed in each of the aligning mark formation regions 2, 3, and 4, as shown in FIG. 1B. Since the aligning marks 5 are formed in the scribing region in this manner, the semiconductor substrate can be utilized effectively.

A method of manufacturing the DRAM with the above arrangement will be described with reference to FIGS. 2A to 2D and FIGS. 3 and 4. The sectional views of the aligning mark formation region shown in FIGS. 2A to 2D and FIGS. 3 and 4 are taken along the line A-A' of FIG. 1B.

Figure 2A:
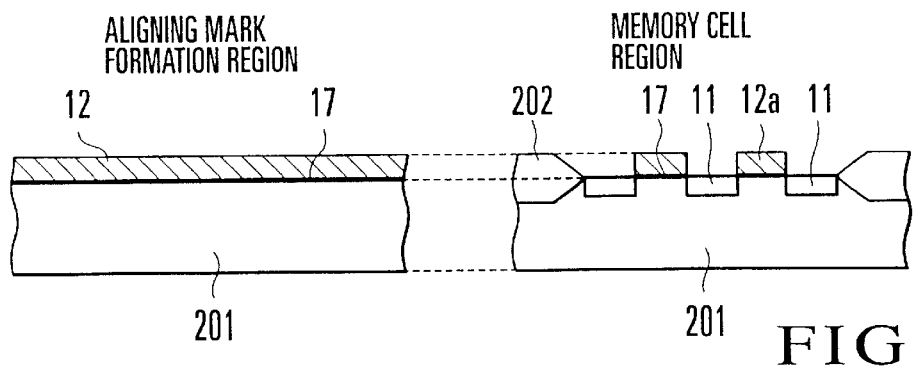
FIGS. 2A to 2D, and FIGS. 3, 4, and 5 are sectional views, including sectional views taken along the line A-A' of FIG. 1B, to show the steps in a method of manufacturing the DRAM according the embodiment of the present invention.

First, as shown in FIG. 2A, a field oxide film 202 with a thickness of about 400 nm is selectively formed on a p-type silicon semiconductor substrate 201 by LOCOS (LOCal Oxidation of Silicon) or the like, and subsequently a gate oxide film 17 is formed on the entire surface of the semiconductor substrate 201.

After the gate oxide film 17 is formed, a first polysilicon layer 12 with a thickness of about 200 nm is formed on the entire surface of the semiconductor substrate 201. Subsequently, to form word lines (first lower interconnections) 12a in the memory cell region, a resist film is formed on the first polysilicon layer 12. This resist film is exposed and developed to obtain a resist pattern. Using this resist pattern as a mask, the first polysilicon layer 12 is etched (patterned). At this time, the first polysilicon layer 12 is intentionally left in the aligning mark formation region.

An impurity (e.g., phosphorus) is ion-implanted in the semiconductor substrate 201 by self-alignment by using the word lines 12a, to form N-diffusion layers 11 in regions corresponding to a source and drain.

Figure 2B:
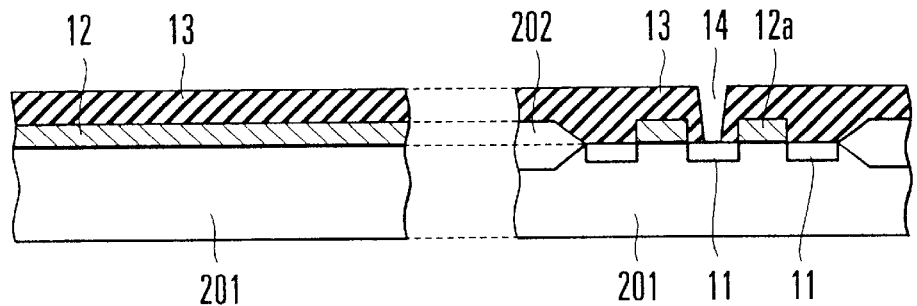

The resist film is removed, and as shown in FIG. 2B, a first interlevel insulating layer 13 (e.g., an $SiO_2$ film) with a thickness of about 300 nm is formed on the entire surface of the semiconductor substrate 201, i.e., on the semiconductor substrate 201 including the first polysilicon layer 12 and word lines 12a. A contact hole 14 is selectively formed in the first interlevel insulating layer 13 to connect a bit line 15a (second lower interconnection; see FIG. 2C), which is to be formed in the subsequent step, to the N-diffusion layer 11.

Figure 2C:
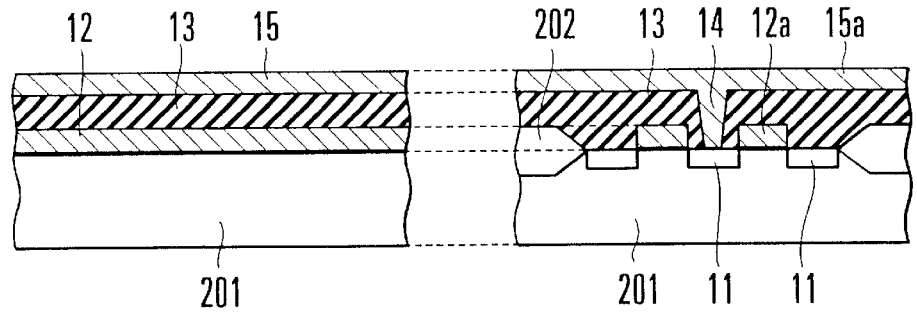

In order to form the bit line 15a in the memory cell region, a second polysilicon layer 15 with a thickness of about 200 nm is formed on the entire surface of the semiconductor substrate 201, i.e., on the first interlevel insulating layer 13 including the contact hole 14, to bury the contact hole 14. A resist film (not shown) is formed on the second polysilicon layer 15, and is exposed and developed to form a resist pattern. Using this resist pattern as a mask, the second polysilicon layer 15 is etched to form the bit line 15a. At this time, the second polysilicon layer 15 is intentionally left in the aligning mark formation region, as shown in FIG. 2C, in the same manner as in the process of forming the word lines 12a. The bit line 15a left in the memory cell region is connected to the N-diffusion layer 11 through a silicon layer (plug) deposited in the contact hole 14.

Figure 2D:
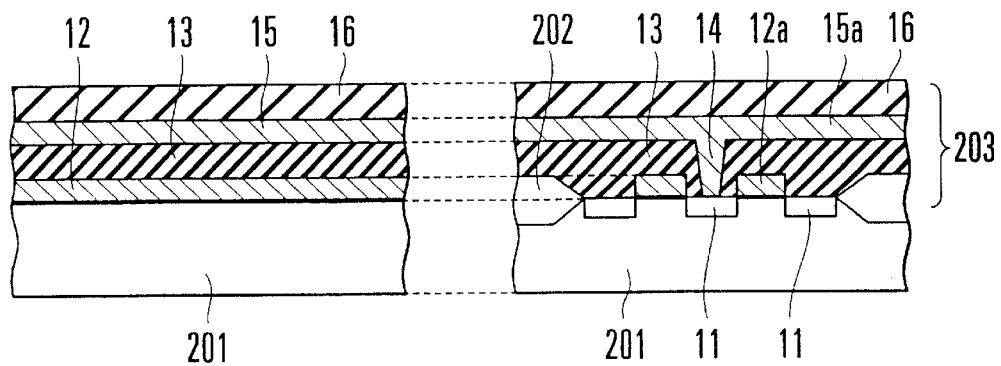

As shown in FIG. 2D, a second interlevel insulating film 16 (e.g., an $SiO_2$ film) with a thickness of about 300 nm is formed on the entire surface of the semiconductor substrate 201, i.e., on the interlevel insulating layer 13 including the polysilicon layer 15 and bit line 15a.

Figure 3:
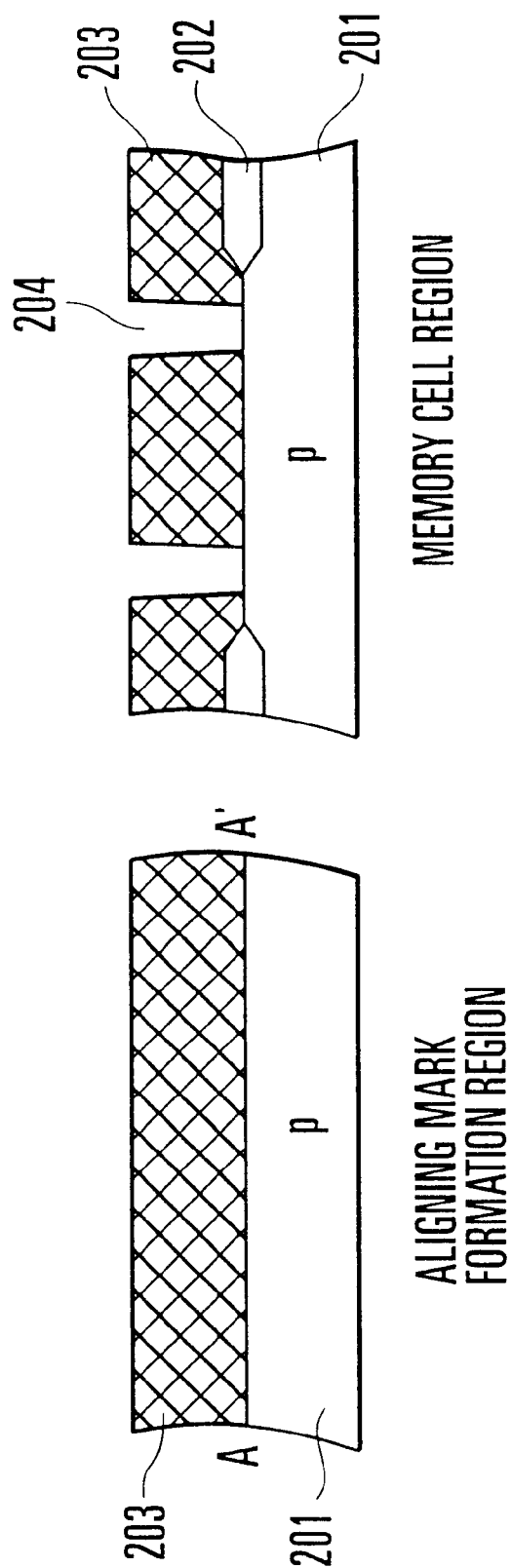

The first polysilicon layer 12/word lines 12a, first interlevel insulating layer 13, second polysilicon layer 15/bit line 15a, and second interlevel insulating film 16, which are formed in the memory cell region and aligning mark formation region, are grouped together to form a first interlevel film 203 in FIG. 3. At this stage, the total thickness of the first interlevel film 203 is about 1,000 nm. This value stays equal between the memory cell region and aligning mark formation region.

Figure 4:
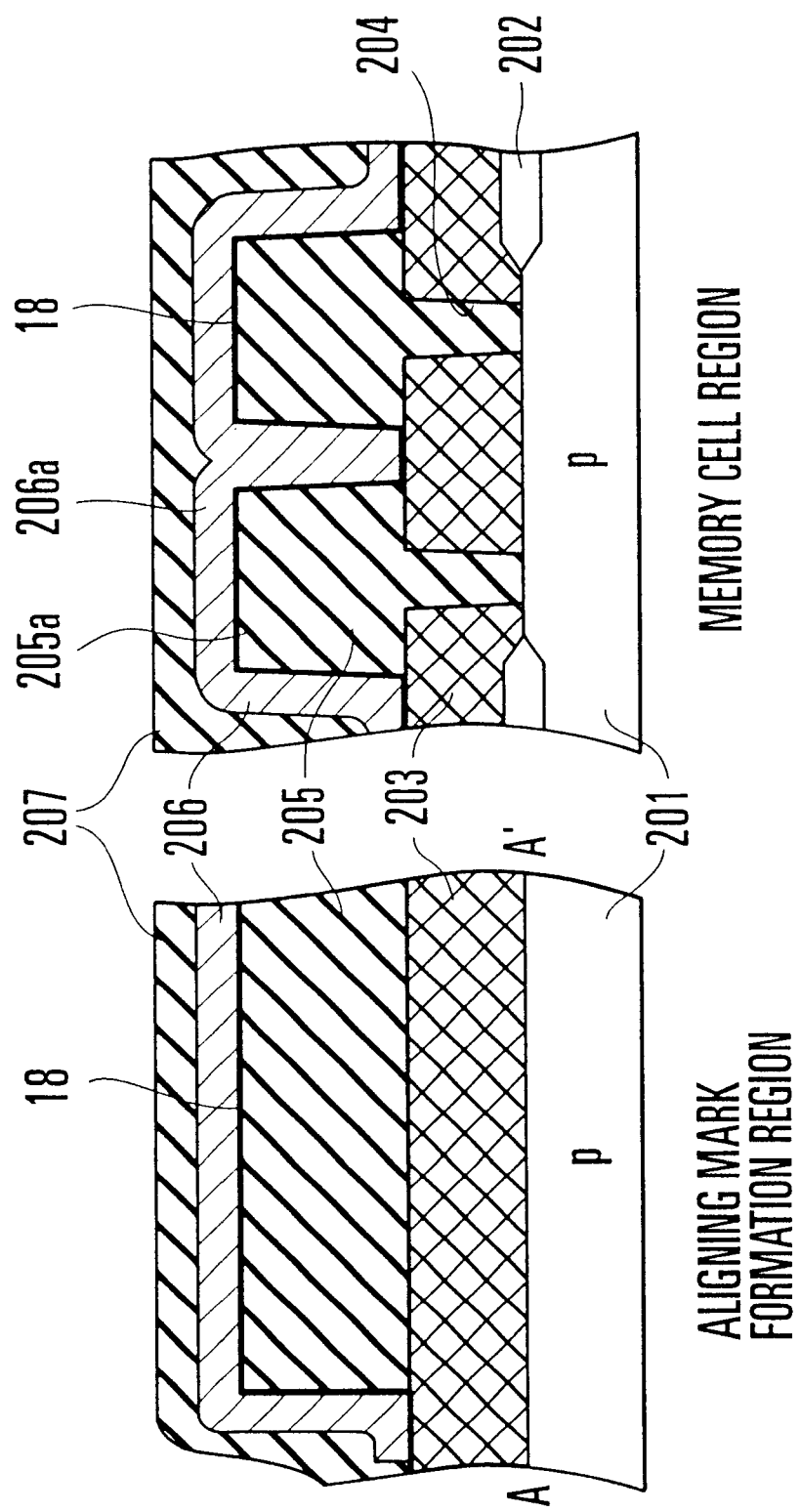

As shown in FIG. 3, contact holes 204 are formed to connect storage electrodes 205a (FIG. 4), which are to be formed on the first interlevel film 203 in a subsequent step, to the N-diffusion layers 11. After the contact holes 204 are formed, in order to form the storage electrodes 205a in the memory cell region, a third polysilicon layer 205 with a thickness of about 500 nm to 800 nm is formed on the entire surface of the semiconductor substrate 201, i.e., on the first interlevel film 203, and is patterned. At this time, the third polysilicon layer 205 is intentionally left in the aligning mark formation region, as shown in FIG. 4, in the same manner as in formation of the word lines 12a and bit line 15a.

To form a DRAM capacitor portion, a capacitor insulating film 18 and a fourth polysilicon layer 206 with a thickness of about 200 nm are sequentially formed on the entire surface of the semiconductor substrate 201, i.e., on the exposed portion of the first interlevel film 203 and on the third polysilicon layer 205. Subsequently, a resist film (not shown) is formed on the fourth polysilicon layer 206, and is exposed and developed to form a resist pattern. Using this resist pattern as a mask, the fourth polysilicon layer 206 is etched to form a plate electrode 206a. Simultaneously, the fourth polysilicon layer 206 in the aligning mark forming region is intentionally left, as shown in FIG. 4.

A third interlevel insulating film 207 (e.g., an $SiO_2$ film or BPSG (Boron-doped Phospho Silicate Glass) film) with a thickness of about 500 nm is formed on the entire surface of the semiconductor substrate 201, i.e., on the fourth polysilicon layer 206. Subsequently, etch-back and a reflow process (e.g., in an $N_2$ atmosphere at 850° C. for 10 min) are performed to planarize the third interlevel insulating film 207.

At this stage, the thickness of the semiconductor device from the upper surface of the semiconductor substrate 201 is about 2,000 nm to 2,300 nm both in the memory cell region and aligning mark formation region, and substantially no step is formed between the memory cell region and aligning mark formation region.

Figure 5:
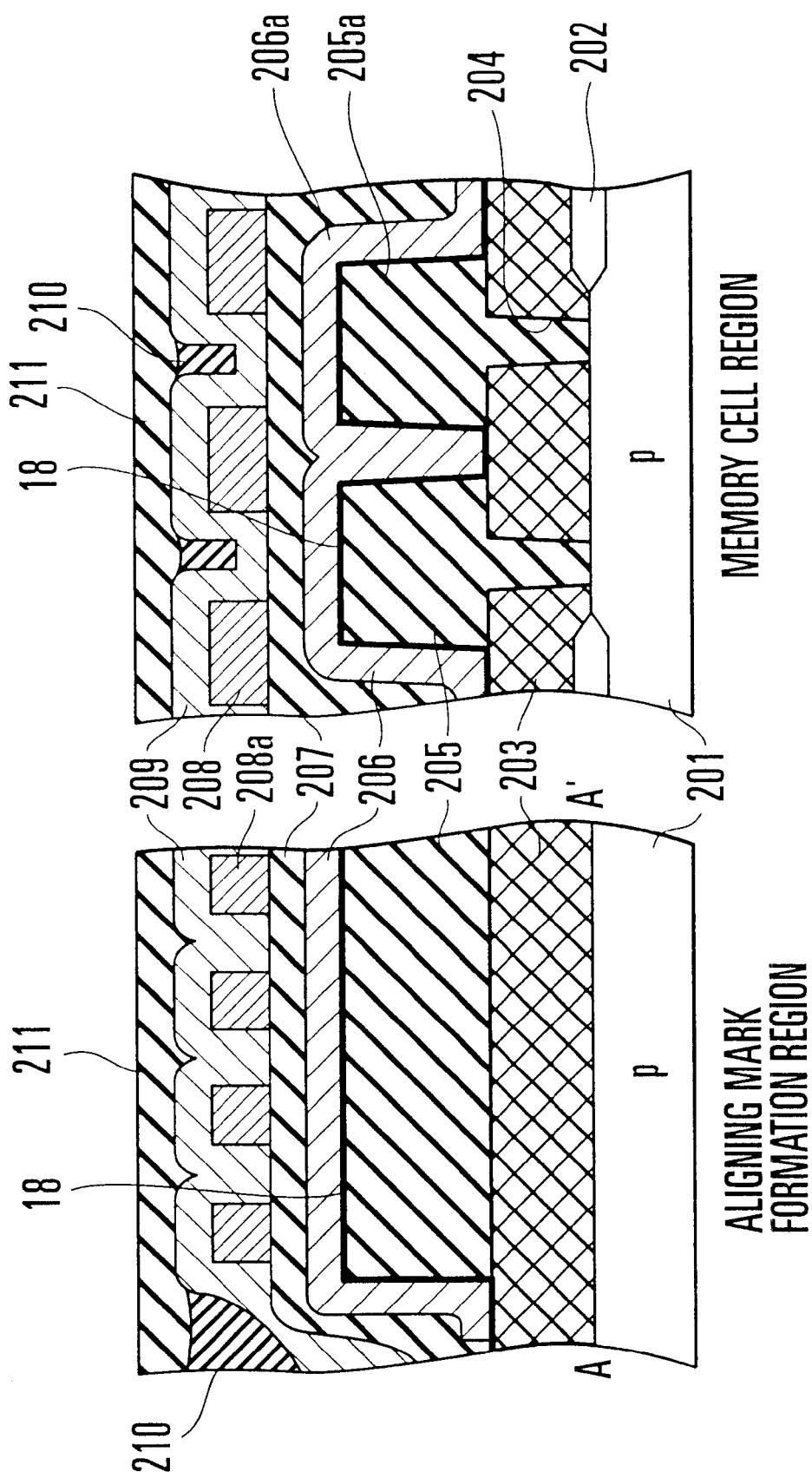
Figure 6:
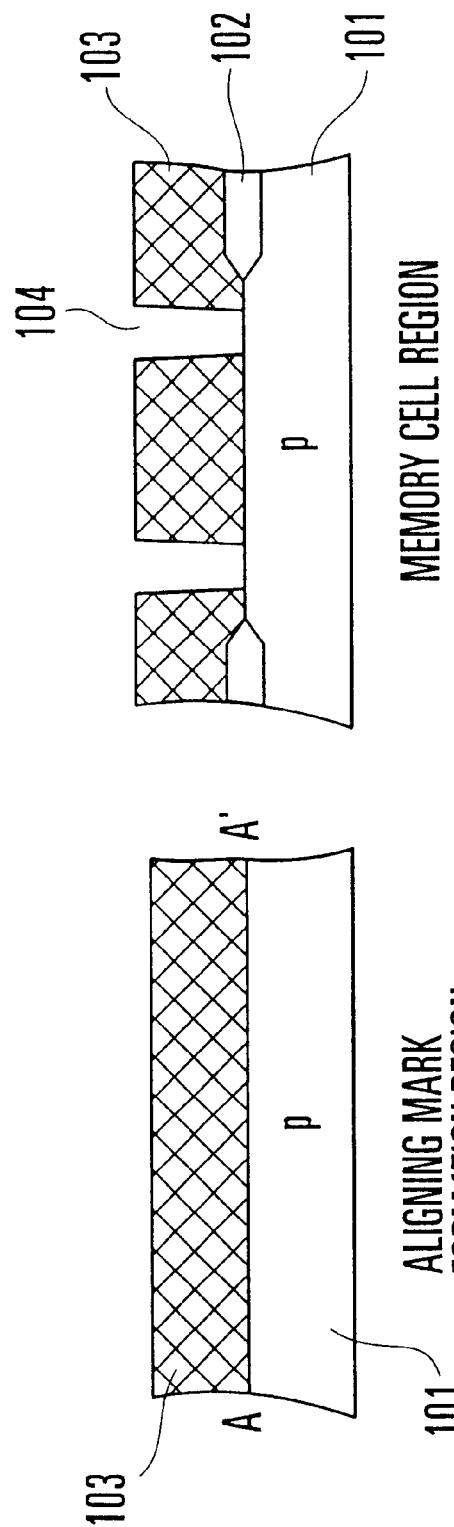
FIGS. 6 to 8 are sectional views showing the steps in a conventional semiconductor device manufacturing method.
Figure 7:
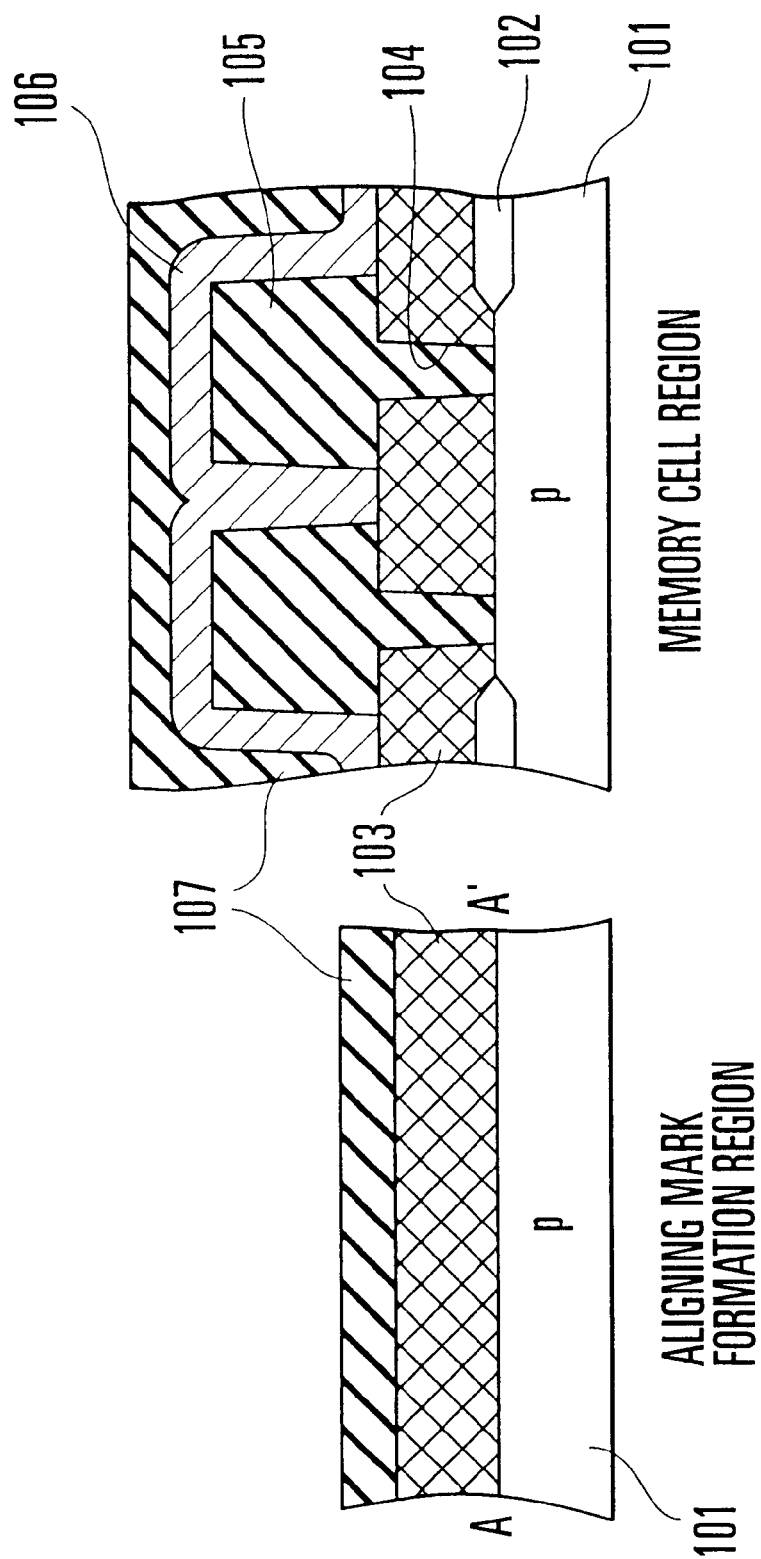
Figure 8:
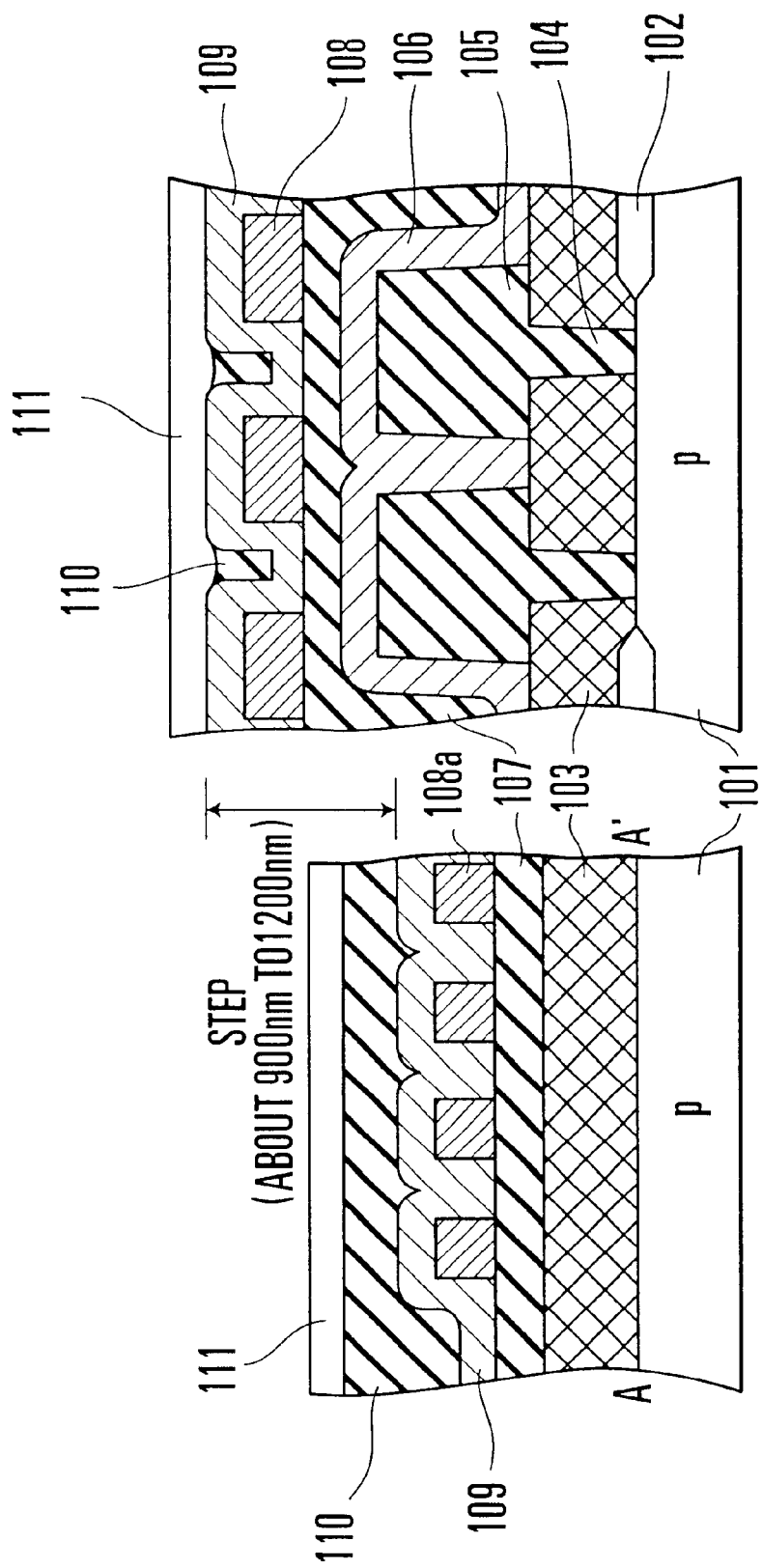

To form upper interconnection layers 208 and aligning marks 208a, a W (tungsten) or Al (aluminum) film with a thickness of about 400 nm to 500 nm is formed on the semiconductor substrate 201, i.e., on the third interlevel insulating film 207. After that, a resist film is formed on the W or Al film, and the W or Al film is etched. All insulating films and conductive layers formed under the upper interconnection layers 208 are also formed under the aligning marks 208a. Therefore, the aligning marks 208a are flush with the upper interconnection layers 208, as shown in FIG. 5.

After the upper interconnection layers 208 and aligning marks 208a are formed, a fourth interlevel insulating film 209 (e.g., a Plasma $SiO_2$ film) with a thickness of about 400 nm is formed as an SOG (Spin On Glass) layer on the entire surface of the semiconductor substrate 201, i.e., on the third interlevel insulating film 207 including the upper interconnection layers 208 and aligning marks 208a. Then, in order to planarize the memory cell region, a silica film 210 is formed on the entire surface of the semiconductor substrate 201, i.e., on the fourth interlevel insulating film 209, and is etched back. Thus, the silica film 210 fills the recesses in the interlevel insulating film 209 which are formed among the upper interconnection layers 208, as shown in FIG. 5, so the memory cell region is planarized.

The silica film 210 is formed also on the aligning marks 208a, and the aligning mark formation region is also planarized, in the same manner as the memory cell region. At this time, since all insulating films and conductor layers constituting the memory cell region are formed also in the aligning mark formation region, substantially no step is formed between the aligning marks 208a and upper interconnection layers 208. Thus, the thickness of the silica film 210 formed in the aligning mark formation region is substantially equal to that of the silica films 210 formed in the memory cell region. In the planarizing process for the memory cell region and aligning mark formation region, the silica film 210 on the aligning marks 208a is removed substantially entirely.

Finally, a fifth interlevel insulating film 211 (e.g., a Plasma $SiO_2$ film) with a thickness of about 400 nm is formed on the entire surface of the semiconductor substrate 201, i.e., on the fourth interlevel insulating film 209 including the silica film 210. Since the fifth interlevel insulating film 211 is formed in the memory cell region and aligning mark formation region that are planarized by the silica film 210 in the previous step, the surface of the fifth interlevel insulating film 211 is sufficiently planar.

In order to form through holes for connecting a conductive layer (not shown), to be formed on the fifth interlevel insulating film 211 in a subsequent step, to the upper interconnection layers 208, a photoresist film (not shown) is formed on the fifth interlevel insulating film 211. The photoresist film is exposed by using a reduction projection exposure apparatus (stepper) in which a reticle having an arbitrary circuit pattern is set.

At this time, the aligning marks (grid) 208a are irradiated with a laser beam, and the reticle and the semiconductor substrate 201 are aligned relative to each other by the beam diffracted by the aligning marks 208a. Since the silica film 210 does not exist on the aligning marks 208a at all (or substantially), the diffracted light from the aligning marks 208a can be detected accurately. As a result, alignment can be performed accurately, and a finer micropattern can be formed.

After the photoresist film is exposed, it is developed to form a pattern. Using this pattern as an etching mask, the fourth and fifth interlevel insulating films 209 and 211 are etched by anisotropic etching. Thus, through holes (not shown) for connecting the upper interconnection layers 208 and the conductor layer on the fifth interlevel insulating film 211 are formed.

According to this embodiment, since all the insulating films and conductive layers constituting the memory cell region are also formed in the aligning mark formation region, the heights of the upper interconnection layers 208 in the memory cell region and those of the corresponding aligning marks 208a can be set substantially equal to each other. Hence, the silica film 210 used for the planarizing process of the memory cell region is not left on the aligning marks 208a in a large amount, and the diffracted light from the aligning marks 208a can be detected accurately.

Various modifications and applications can be made in the above embodiment. For example, although the aligning marks 208a are formed in the scribing region in the above embodiment, they can be formed in an arbitrary region that does not directly influence a circuit to be formed. Although the above embodiment exemplifies a DRAM as a semiconductor device, the present invention can be applied to formation of aligning marks in any arbitrary semiconductor devices other than a DRAM, e.g., an SRAM (Static Random Access Memory), or a logic circuit. Also, the materials and thicknesses are shown merely as examples, and arbitrary materials and thicknesses can be selected.

As has been described above, according to the present invention, since the circuit formation region and aligning mark formation region are formed with substantially the same arrangements, an interconnection pattern and aligning marks corresponding to it can be formed with the same height. In addition, when a gap formed in the interconnection pattern is to be filled with an insulator in order to planarize the circuit formation region, the insulator formed in the aligning mark formation region is etched back as the circuit formation region is planarized, and a large amount of insulator is not left on the aligning marks. Therefore, the aligning marks can be detected accurately by using the diffracted light, so that high-precision alignment can be performed. Also, the circuit formation region and the aligning mark formation region are highly flat so that they can be aligned easily.

What is claimed is:

1. A method of manufacturing a semiconductor device having a circuit formation region where a semiconductor circuit is to be formed and an aligning mark formation region where an aligning mark used for alignment of a mask is to be formed, comprising the steps of:

forming a first conductive layer on a semiconductor substrate and thereafter patterning the first conductive layer, thereby forming a circuit pattern in the circuit formation region and leaving the first conductive layer in the aligning mark formation region;

forming a first insulating film on the semiconductor substrate including the circuit pattern and the first conductive layer;

forming a second conductive layer on the first insulating film and thereafter patterning the second conductive layer, thereby forming an interconnection pattern in the circuit formation region and an aligning mark in the aligning mark formation region; and forming a second insulating film on the interconnection pattern and the aligning mark and thereafter etching back the second insulating film, thereby planarizing the circuit formation region and the aligning mark formation region and removing the second insulating film on the aligning mark.

2. A method according to claim 1, wherein the step of patterning the first conductive layer and the step of forming the first insulating layer are repeated, and after that the step of patterning the second conductive layer is performed.

3. A method according to claim 1, wherein the method further comprises the step of forming an interlevel film, including an insulating film and a conductive layer on the semiconductor substrate, and the step of patterning the first conductive layer includes the step of forming the first conductive layer on the interlevel film.

4. A method according to claim 1, further comprising the steps of forming a patterning target layer on an SOG (Spin On Glass) layer constituting the second insulating film, forming a resist film on the patterning target layer, aligning a photomask and the semiconductor substrate relative to each other by using the aligning mark, and after alignment, exposing the resist film.

5. A method according to claim 1, wherein the aligning mark comprises a diffraction grating.

6. A method according to claim 1, wherein the aligning mark formation region is formed in a scribing region which is to be subjected to dicing.

7. A method of forming a semiconductor device having a memory cell region where a memory cell element for a DRAM (Dynamic Random Access Memory) is to be formed and an aligning mark formation region to be used for alignment of a mask, comprising the steps of:

forming a first conductive layer on a semiconductor substrate and thereafter patterning the first conductive layer, thereby forming a word line in the memory cell region and leaving the first conductive layer in the aligning mark formation region;

forming a first insulating film on the semiconductor substrate including the word line and the first conductive layer;

forming a second conductive layer on the first insulating film and thereafter patterning the second conductive layer, thereby forming a bit line in the memory cell region and leaving the second conductive layer in the aligning mark formation region;

forming a second insulating film on the first insulating film including the bit line and the second conductive layer;

forming a third conductive layer on the second insulating film and thereafter patterning the third conductive layer, thereby forming a storage electrode in the memory cell region and leaving the third conductive layer in the aligning mark formation region;

forming a capacitor insulating film on the storage electrode, the third conductive layer, and the second insulating film;

forming a fourth conductive layer on the capacitor insulating film and thereafter patterning the fourth conductive layer, thereby forming a plate electrode in the memory cell region and leaving the fourth conductive layer in the aligning mark formation region;

forming a third insulating film on the plate electrode and the fourth conductive layer;

forming a fifth conductive layer on the third insulating film and thereafter patterning the fifth conductive layer, thereby forming an upper interconnection layer on the memory cell region and an aligning mark in the aligning mark formation region; and applying silica to the memory cell region and the aligning mark formation region so as to fill a space in the upper interconnection layer with silica, and thereafter etching back silica, thereby planarizing the memory cell region and the aligning mark formation region.

8. A method according to claim 7, further comprising the steps of forming a patterning target layer in the planarized memory cell region and aligning mark formation region, forming a resist film on the patterning target layer, aligning a photomask and the semiconductor substrate relative to each other by using the aligning mark, and exposing the resist film after alignment.

9. A method according to claim 7, wherein the method further comprises the step of forming, before applying silica, a fourth insulating film on the third insulating film including the upper interconnection layer and the aligning mark, and the step of planarizing includes the step of filling a recess formed in the upper interconnection layer so as to form silica on the fourth insulating film, and thereafter etching back silica.

10. A method according to claim 7, wherein the aligning mark comprises a diffraction grating.

11. A method according to claim 7, wherein the aligning mark formation region is formed in a scribing region which is to be subjected to dicing.

* * * * *